(12) United States Patent
Zhang et al.

(10) Patent No.: US 7,041,511 B2
(45) Date of Patent: May 9, 2006

(54) PT/PGO ETCHING PROCESS FOR FERAM APPLICATIONS

(75) Inventors: Fengyan Zhang, Vancouver, WA (US); Bruce D. Ulrich, Beaverton, OR (US); Lisa H. Stecker, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/923,381

(22) Filed: Aug. 20, 2004

(65) Prior Publication Data

US 2006/0040413 A1    Feb. 23, 2006

(51) Int. Cl.
*H01L 21/00* (2006.01)
*H01L 21/20* (2006.01)

(52) U.S. Cl. .......................................... 438/3; 438/381
(58) Field of Classification Search .................... 438/3, 438/240, 381, 386, 387, 393, 396
See application file for complete search history.

(56) References Cited

U.S. PATENT DOCUMENTS

| 5,453,305 | A  | * | 9/1995  | Lee ............................. 427/562 |
| 5,854,104 | A  | * | 12/1998 | Onishi et al. ................ 438/240 |
| 6,420,740 | B1 | * | 7/2002  | Zhang et al. ................ 257/295 |
| 6,593,228 | B1 | * | 7/2003  | Weinrich et al. ............. 438/633 |
| 2003/0143800 | A1 | * | 7/2003 | Hall et al. ................... 438/240 |
| 2004/0157459 | A1 | * | 8/2004 | Ying et al. ................... 438/706 |

* cited by examiner

*Primary Examiner*—Scott B. Geyer
(74) *Attorney, Agent, or Firm*—David C. Ripma

(57) ABSTRACT

A method of etching a noble metal top electrode on a ferroelectric layer while preserving the ferroelectric properties of the ferroelectric layer and removing etching residue includes preparing a substrate; depositing a barrier layer on the substrate; depositing a bottom electrode layer on the barrier layer; depositing a ferroelectric layer on the bottom electrode layer; depositing a noble metal top electrode layer on the ferroelectric layer; depositing an adhesion layer on the top electrode layer; depositing a hard mask layer on the adhesion layer; patterning the hard mask; etching the noble metal top electrode layer in an initial etching step at a predetermined RF bias power, which produces etching residue; and over etching the noble metal top electrode layer and ferroelectric layer at an RF bias power lower than that of the predetermined RF bias power to remove etching residue from the initial etching step.

15 Claims, 2 Drawing Sheets

PT/PGO ETCHING PROCESS FOR FERAM APPLICATIONS

FIELD OF THE INVENTION

This invention relates to a Pt/PGO stack etching method for use in FeRAM applications, such as MFMIS, MFMS, MFIS, MIFS, MFS, MIFIMIS types of FeRAMs. It may also be used during fabrication of DRAMs, capacitors, pyroelectric infrared sensors, optical displays, optical switches, piezoelectric transducers, and surface acoustic wave devices applications.

BACKGROUND OF THE INVENTION

Platinum metal is relatively hard to etch, regardless of whether wet or dry etching is performed. When platinum used as top electrode, as in a platinum/ferroelectric stack structure, the etching of the platinum layer becomes more complicated, as the ferroelectric material is usually easily attacked by any dry or wet etching process which is suitable for etching platinum, resulting in degraded ferroelectric properties, or complete loss of ferroelectric properties, of the ferroelectric layer. Lead Germanium Oxide ($Pb_5Ge_3O_{11}$) (PGO) is a ferroelectric material that may be used in single transistor applications. PGO may be wet etched by most etching chemicals, such as HF. The etching process of a Pt/PGO stack, and any post etch cleaning process, becomes more complicated. The etching of a Pt/PGO stack using photoresist as the mask and chlorine and argon as the chemistry is known, however, the resulting etching residue cannot easily be cleaned without damaging the underlying PGO thin film.

SUMMARY OF THE INVENTION

A method of etching a platinum top electrode on a PGO ferroelectric layer while preserving the ferroelectric properties of the PGO ferroelectric layer and removing etching residue during fabrication of a semiconductor device includes preparing a substrate; depositing a barrier layer on the substrate; depositing an iridium bottom electrode layer on the barrier layer; depositing a PGO ferroelectric layer on the iridium bottom electrode layer; depositing a platinum top electrode layer on the PGO ferroelectric layer; depositing an adhesion layer on the platinum top electrode layer; depositing a hard mask layer on the adhesion layer; applying photoresist to the hard mask layer, and patterning and developing the photoresist; patterning the hard mask; etching the noble metal top electrode layer in an initial etching step at a substrate RF bias power of between about 10 W to 1000 W, which produces etching residue; over etching the noble metal top electrode layer and ferroelectric layer at an RF bias power in a range of between about 5 W to 150 W to remove etching residue from the initial etching step; and completing the semiconductor device.

It is an object of the invention to provide an etching process for platinum to eliminate the etching residue.

Another object of the invention is to minimize the etching damage to any underlying ferroelectric layer.

A further object of the invention is to provide a method for etching a platinum top electrode on a PGO layer while eliminating etching residue and not damaging the PGO layer.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
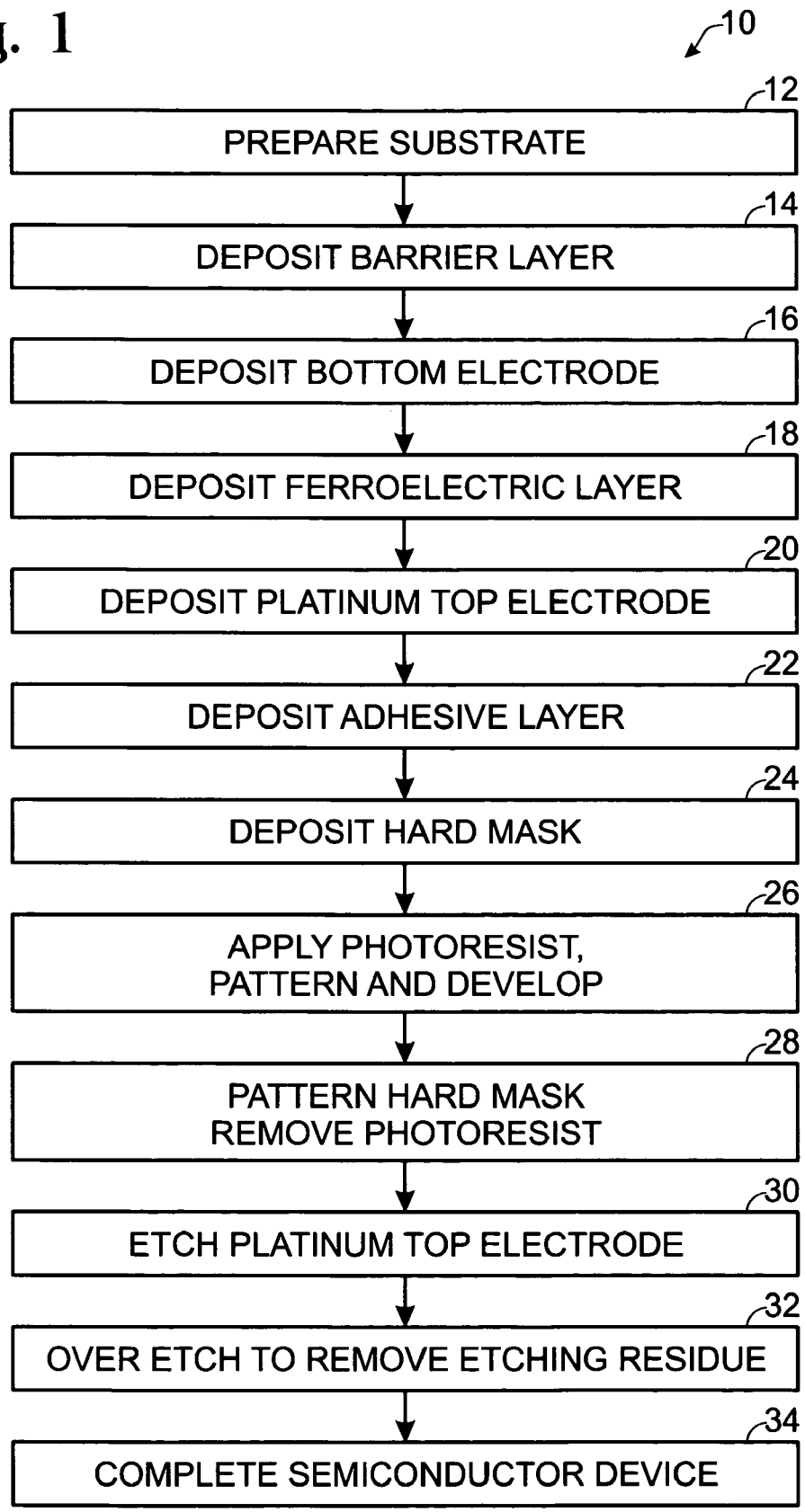
FIG. 1 is a block diagram of the method of the invention.
Figure 2:
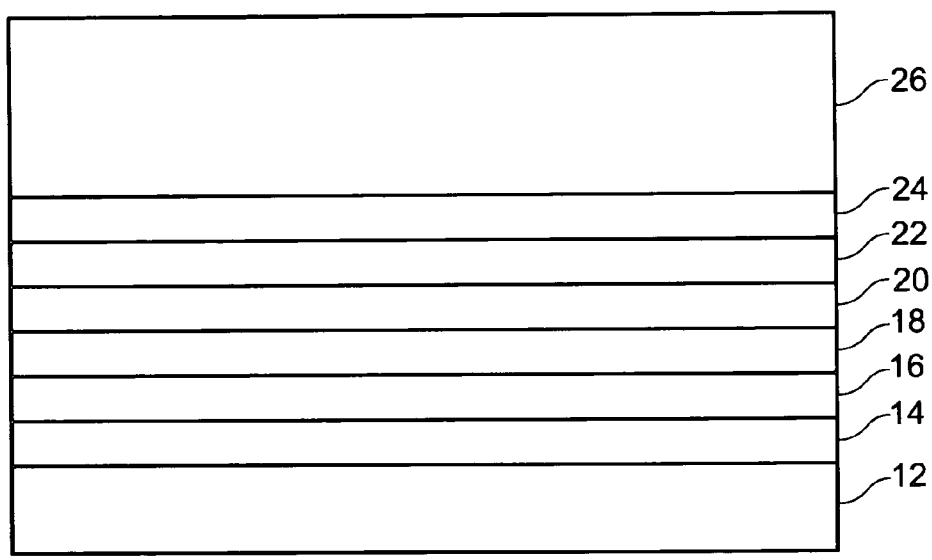
FIG. 2 depicts a cross section of a device during fabrication according to the method of the invention.

Referring to FIG. 1, the method of the invention is depicted generally at 10. Referring to FIGS. 1 and 2, initially, a substrate 12 is prepared. Substrate 12 may be silicon, silicon dioxide, or polysilicon. A barrier layer 14 is deposited on substrate 12. Barrier layer 14 may be fabricated of Ta, TaN, Ti, TiN, TiAlN, TaAlN, TiSiN, TaSiN, TiAl, or TiAlN. A bottom electrode layer 16, formed of iridium in the preferred embodiment, is deposited on barrier layer 14.

A lead germanium oxide ($Pb_5Ge_3O_{11}$)(PGO) ferroelectric layer 18, in the preferred embodiment, is deposited on the iridium bottom electrode, and a noble metal top electrode layer 20, such as a platinum top electrode, is deposited on the PGO. The method of the invention uses a layer of $SiO_2$, such as tetraethylorthosilicate oxide (oxane)(TEOS) as the hard mask layer, however, because the adhesion between platinum and $SiO_2$ is poor, a thin, adhesion layer of titanium 22, e.g., between about 10 nm to 100 nm, is deposited on platinum top electrode 20 before deposition of the $SiO_2$ hard mask 24. The thickness of the $SiO_2$ hard mask is between about 100 nm to 1000 nm, depending on the thickness of platinum top electrode 20 which is to be etched.

A photoresist layer 26 is applied to $SiO_2$ layer 24, patterned with the requisite pattern and developed. After the $SiO_2$ hard mask is patterned by any state-of-the-art process, the photoresist is removed 28, leaving the wafer ready for platinum etching.

In the case of a MFIS-type of single transistor application, PGO may be deposited on an insulating layers, such as $ZrO_2$, $HfO_2$ or doped $ZrO_2$ and $HfO_2$ thin films. The remainder of the process is similar to that described above.

The platinum etching of the method of the invention 30 uses a gas mixture chemistry of argon and chlorine. $Cl_2$ gas may be replaced by $BCl_3$, $CCl_4$, $SiCl_4$, or their combinations. The total gas flow rate is between about 20 sccm to 100 sccm, and it is preferred at between about 40 sccm to 70 sccm. The process pressure is between about 1 mtorr to 50 mtorr, and it is preferred at between about 3 mtorr to 10 mtorr. The microwave power is between about 400 W to 1000 W, and the substrate RF bias power is between about 10 W to 1000 W. The substrate temperature is between about −50° C. to 500° C., and it is preferred to be in a range of between about room temperature to 100° C. The percentage of Ar in the gas chemistry is in the range of between about 5% to 80%, and is preferred at between about 50% to 80%. The remaining gas is the $Cl_2$ chemistry.

After the initial etching of the platinum top electrode, an over-etching step 32 is performed, at lower RF bias power, to eliminate the etching residue. The power range of the RF bias is between about 5 W to 150 W. This over etching will effectively clean the etching residue without damaging the underlying ferroelectric layer. The semiconductor device is then completed according to state-of-the-art processes, 34.

Figure 3:
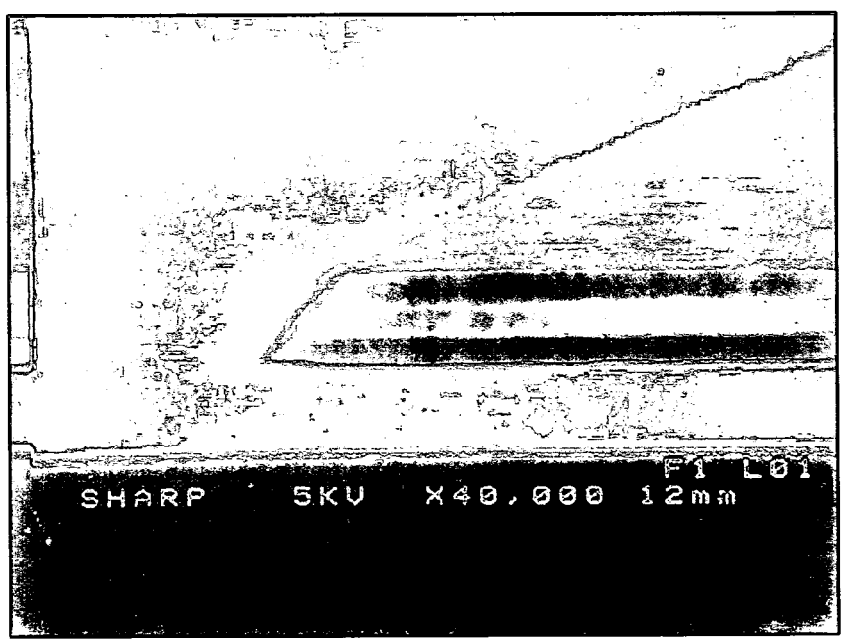
FIG. 3 depicts an etch profile of $SiO_2/Ti/Pt/Ti/SiO_2$ by using $SiO_2$ as the hard mask.

An example of the preferred embodiment of the method of the invention includes the use of any state-of-the-art, high-density plasma reactor as an etching system. An example is an Electron Cyclotron Resonance (ECR) plasma reactor. In this case, the ion density and ion energy in the plasma are controlled independently by adjusting the ECR microwave power and the RF bias power. The gas chemistry includes between about 20% to 80% argon, and between about 80% to 20% of chlorine chemistry, such as $Cl_2$, or equivalent. The process pressure is between about 5 mtorr to 10 mtorr. The microwave power is between about 500 W to 800 W, and the initial etching RF bias power is between about 100 W to 400 W. The over etching step is performed at low RF bias power in the range of between about 5 W to 150 W. FIG. 3 depicts the etching profile of $SiO_2$ (400 nm)/Ti(20 nm)/Pt(150 nm)/Ti(50 nm)/$SiO_2$ by using $SiO_2$ as the hard mask.

Thus, an etching process for etching a platinum top electrode on a ferroelectric layer for FeRAM applications has been disclosed. It will be appreciated that further variations and modifications thereof may be made within the scope of the invention as defined in the appended claims.

We claim:

1. A method of etching a noble metal top electrode on a ferroelectric layer while preserving the ferroelectric properties of the ferroelectric layer and removing etching residue during fabrication of a semiconductor device, comprising:
    preparing a substrate;
    depositing a barrier layer on the substrate;
    depositing a bottom electrode layer on the barrier layer;
    depositing a ferroelectric layer on the bottom electrode layer;
    depositing a noble metal top electrode layer on the ferroelectric layer;
    depositing an adhesion layer on the top electrode layer;
    depositing a hard mask layer on the adhesion layer;
    applying photoresist to the hard mask layer, and patterning and developing the photoresist;
    patterning the hard mask;
    etching the noble metal top electrode layer in an initial etching step at a predetermined RF bias power, which produces etching residue; and
    over etching the noble metal top electrode layer and ferroelectric layer at an RF bias power lower than that of the predetermined RF bias power to remove etching residue from the initial etching step.

2. The method of claim 1 wherein said initial etching step includes etching in a state-of-the-art, high-density plasma reactor as an etching system, using a gas mixture chemistry of argon, wherein the percentage of Ar in the gas mixture chemistry is in the range of between about 50% to 80%, and a chlorine containing gas taken from the group of gases consisting of $Cl_2$, $BCl_3$, $CCl_4$, $SiCl_4$, and their combinations, having a total gas flow rate of between about 20 sccm to 100 sccm, a process pressure of between about 3 mtorr to 10 mtorr., using a microwave power of between about 400 W to 1000 W, and a substrate RF bias power of between about 10 W to 1000 W, with the substrate maintained at a temperature of between about −50° C. to 500° C.

3. The method of claim 1 wherein said over-etching step is performed at a RF bias power range of between about 5 W to 150 W.

4. The method of claim 1 wherein said preparing a substrate includes preparing a substrate taken from the group of substrates consisting of silicon, silicon dioxide, and polysilicon.

5. The method of claim 1 wherein said depositing a barrier layer includes depositing a barrier layer of material taken from the group of materials consisting of Ta, TaN, Ti, TiN, TiAlN, TaAlN, TiSiN, TaSiN, TiAl, and TiAlN.

6. The method of claim 1 wherein said depositing a bottom electrode layer includes depositing a layer of iridium.

7. The method of claim 1 wherein said depositing a ferroelectric layer includes depositing a layer of PGO.

8. The method of claim 1 wherein said depositing a top electrode layer includes depositing a layer of platinum.

9. The method of claim 1 wherein said initial etching step includes etching in a state-of-the-art, high-density plasma reactor as an etching system, using a gas mixture chemistry of argon, wherein the percentage of Ar in the gas mixture chemistry is in the range of between about 5% to 80%, and a chlorine containing gas taken from the group of gases consisting of $Cl_2$, $BCl_3$, $CCl_4$, $SiCl_4$, and their combinations, having a total gas flow rate of between about 40 sccm to 70 sccm, a process pressure of between about 1 mtorr to 50 mtorr, using a microwave power of between about 400 W to 1000 W, and a substrate RF bias power of between about 10 W to 1000 W, with the substrate maintained at a temperature of between about room temperature to 100° C.

10. A method of etching a platinum top electrode on a PGO ferroelectric layer while preserving the ferroelectric properties of the PGO ferroelectric layer and removing etching residue during fabrication of a semiconductor device, comprising:
    preparing a substrate;
    depositing a barrier layer on the substrate;
    depositing an iridium bottom electrode layer on the barrier layer;
    depositing a PGO ferroelectric layer on the iridium bottom electrode layer;
    depositing a platinum top electrode layer on the PGO ferroelectric layer;
    depositing an adhesion layer on the platinum top electrode layer;
    depositing a hard mask layer on the adhesion layer;
    applying photoresist to the hard mask layer, and patterning and developing the photoresist;
    patterning the hard mask;
    etching the noble metal top electrode layer in an initial etching step at a substrate RF bias power of between about 10 W to 1000 W, which produces etching residue; and
    over etching the noble metal top electrode layer and ferroelectric layer at an RF bias power in a range of between about 5 W to 150 W to remove etching residue from the initial etching step.

11. The method of claim 10 wherein said initial etching step includes etching in a state-of-the-art, high-density plasma reactor as an etching system, using a gas mixture chemistry of argon, wherein the percentage of Ar in the gas mixture chemistry is in the range of between about 50% to 80%, and a chlorine containing gas taken from the group of gases consisting of $Cl_2$, $BCl_3$, $CCl_4$, $SiCl_4$, and their combinations, having a total gas flow rate of between about 20 sccm to 100 sccm, a process pressure of between about 3 mtorr to 10 mtorr., using a microwave power of between about 400 W to 1000 W, and a substrate RF bias power of between about 10 W to 1000 W, with the substrate maintained at a temperature of between about −50° C. to 500° C.

12. The method of claim 10 wherein said preparing a substrate includes preparing a substrate taken from the group of substrates consisting of silicon, silicon dioxide, and polysilicon.

13. The method of claim 10 wherein said depositing a barrier layer includes depositing a barrier layer of material taken from the group of materials consisting of Ta, TaN, Ti, TiN, TiAlN, TaAlN, TiSiN, TaSiN, TiAl, and TiAlN.

14. The method of claim 10 wherein said depositing a hard mask layer includes depositing a layer $SiO_2$.

15. The method of claim 10 wherein said initial etching step includes etching in a state-of-the-art, high-density plasma reactor as an etching system, using a gas mixture chemistry of argon, wherein the percentage of Ar in the gas mixture chemistry is in the range of between about 5% to 80%, and a chlorine containing gas taken from the group of gases consisting of $Cl_2$, $BCl_3$, $CCl_4$, $SiCl_4$, and their combinations, having a total gas flow rate of between about 40 sccm to 70 sccm, a process pressure of between about 1 mtorr to 50 mtorr, using a microwave power of between about 400 W to 1000 W, and a substrate RF bias power of between about 10 W to 1000 W, with the substrate maintained at a temperature of between about room temperature to 100° C.

* * * * *